(12) United States Patent
Jin et al.

(10) Patent No.: US 7,397,398 B2
(45) Date of Patent: Jul. 8, 2008

(54) MODULATION BIT ADDED TO WORST CASE CODEWORD

(75) Inventors: Ming Jin, Lake Forest, CA (US); Hiauchoon Kee, Singapore (SG); Zhenyu Sun, Singapore (SG); Liu Li, Singapore (SG); Myint Ngwe, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/431,122

(22) Filed: May 9, 2006

(65) Prior Publication Data

US 2007/0262888 A1 Nov. 15, 2007

(51) Int. Cl.
*H03M 7/00* (2006.01)
(52) U.S. Cl. .......................... 341/59; 341/58
(58) Field of Classification Search .................. 341/58, 341/59, 50; 714/701, 775, 800, 801; 360/46
See application file for complete search history.

(56) References Cited

U.S. PATENT DOCUMENTS

| 5,235,602 | A | | 8/1993 | Klim | 371/49.1 |
| 5,373,513 | A | * | 12/1994 | Howe et al. | 714/775 |
| 5,576,707 | A | | 11/1996 | Zook | 341/58 |
| 5,774,286 | A | * | 6/1998 | Shimoda | 360/46 |
| 6,018,304 | A | * | 1/2000 | Bessios | 341/58 |
| 6,456,208 | B1 | * | 9/2002 | Nazari et al. | 341/59 |
| 6,504,493 | B1 | * | 1/2003 | Burd | 341/50 |
| 6,526,530 | B1 | * | 2/2003 | Nazari et al. | 714/701 |
| 6,606,718 | B1 | | 8/2003 | Bessios | 714/701 |
| 6,606,727 | B1 | | 8/2003 | Yang et al. | 714/774 |
| 6,661,356 | B1 | | 12/2003 | Oberg | 341/58 |
| 6,757,122 | B1 | | 6/2004 | Kuznetsov et al. | 360/53 |
| 6,917,314 | B1 | | 7/2005 | Oberg | 341/58 |
| 6,989,776 | B2 | * | 1/2006 | Tsang | 341/59 |
| 7,038,599 | B2 | * | 5/2006 | Kahlman | 341/58 |
| 7,057,536 | B2 | * | 6/2006 | Lee et al. | 341/59 |
| 7,071,851 | B1 | * | 7/2006 | Blaum et al. | 341/59 |
| 2002/0133778 | A1 | | 9/2002 | Bessios | 714/752 |
| 2002/0188906 | A1 | | 12/2002 | Kurtas et al. | 714/755 |
| 2003/0014718 | A1 | | 1/2003 | De Souza et al. | 714/804 |
| 2004/0093549 | A1 | | 5/2004 | Song et al. | 714/752 |
| 2004/0225950 | A1 | | 11/2004 | Siegel et al. | 714/801 |
| 2005/0034053 | A1 | | 2/2005 | Jacobsen et al. | 714/800 |
| 2005/0104754 | A1 | * | 5/2005 | Varanasi et al. | 341/59 |
| 2005/0104755 | A1 | | 5/2005 | Tsang | 341/59 |
| 2005/0135262 | A1 | | 6/2005 | Pfister | 370/242 |
| 2005/0216819 | A1 | | 9/2005 | Chugg et al. | 714/786 |

* cited by examiner

*Primary Examiner*—Peguy JeanPierre
(74) *Attorney, Agent, or Firm*—Westman, Champlin & Kelly, P.A.

(57) ABSTRACT

A data word is error correction encoded to provide a worst case codeword without bit transitions between worst case codeword bits. A modulation bit is calculated as a function of the worst case codeword. The modulation bit has a bit polarity opposite a bit polarity of the worst case codeword bits. The worst case codeword bits are added with the modulation bit to form a modulated code word.

24 Claims, 6 Drawing Sheets

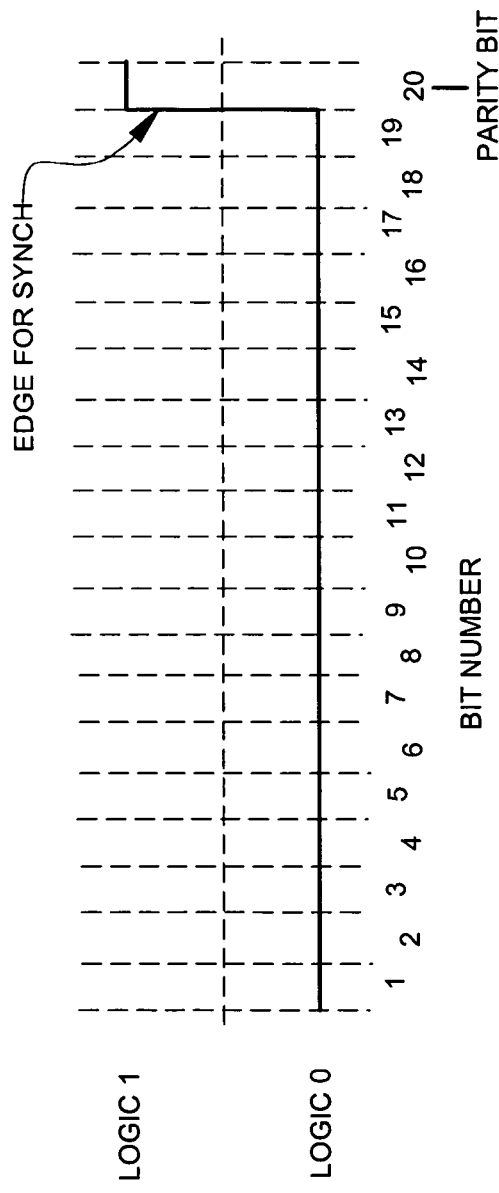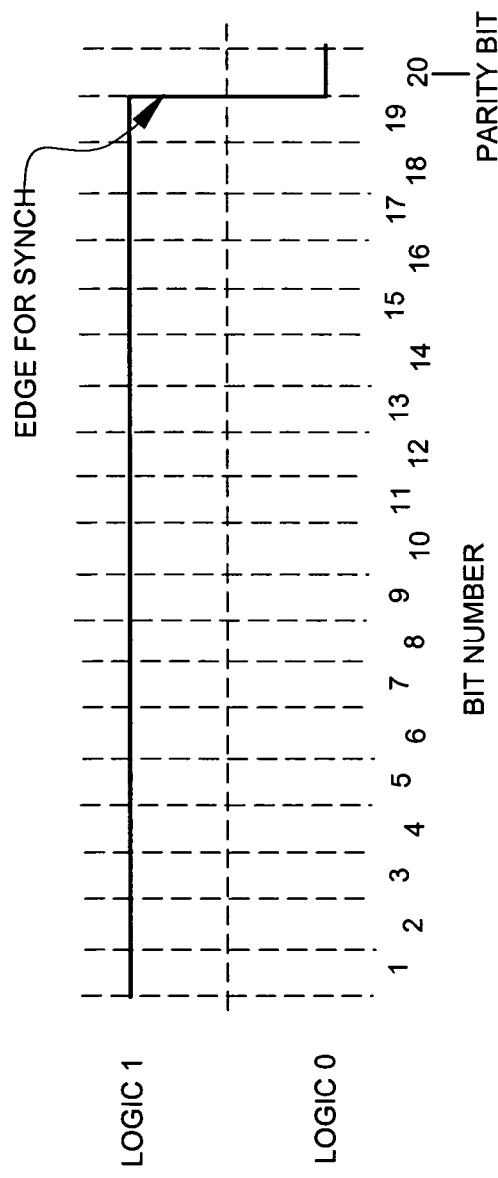

MODULATION BIT ADDED TO WORST CASE CODEWORD

FIELD OF THE INVENTION

The present invention relates to data storage devices, and more particularly but not by limitation to data storage devices that use perpendicular recording.

BACKGROUND OF THE INVENTION

In data storage devices such as disc drives, data is read from a disc by a read operation that involves a mechanical scanning motion of a disc moving relative to a read head. The read data was originally in synchronization with the mechanical motion during writing, but this original synchronization is not available at a later time during readback. The read back data needs to be resynchronized with a readback clock as the data is read and processed by a computer. This process of resynchronization is accomplished by a timing recovery circuit. The timing recovery circuit includes an oscillator that is repeatedly synchronized by the time position of transitions of the read data.

Known data storage devices use DC free coding (such as run length limited (RLL) coding) to set limits on the length of time between transitions which ensures that the oscillator does not drift too far between transitions and to limit the bandwidth of the read back signal to a narrow frequency band. Run length limited or DC free coding, however, adds undesired overhead such as slow coding rates and time delays due to decoding the DC free coding.

With the use of perpendicular recording, readback signals can be obtained that include DC levels of bits as well as transitions between bits. The need for DC free coding is considerably reduced or eliminated, however, there is a need for oscillator synchronization with perpendicular recording.

A method and apparatus are needed to avoid the high overhead of existing DC free coding schemes while providing the timing recovery needed to keep a read oscillator synchronized. Embodiments of the present invention provide solutions to these and other problems, and offer other advantages over the prior art.

SUMMARY OF THE INVENTION

Disclosed is an apparatus. The apparatus comprises electronics. The error electronics provide worst case codewords without bit transitions between worst case codeword bits.

The apparatus comprises electronic circuitry. The electronic circuitry calculates a modulation bit as a function of the worst case codeword bits. The electronic circuitry adds the modulation bit to the worst case codeword bits to form a modulated codeword. The modulation bit has a bit polarity opposite a bit polarity of the worst case codeword bits to provide a bit transition. The apparatus comprises decoder electronics that decode the modulated code word.

In one embodiment, the worst case codeword has an odd number of bits, the modulation bit comprises a parity bit, and the bit transition synchronizes a readback oscillator.

Other features and benefits that characterize embodiments of the present invention will be apparent upon reading the following detailed description and review of the associated drawings.

BRIEF DESCRIPTION OF THE DRAWINGS

FIGS. 5A-5B illustrate worst case modulation code word in which all of the data bits are either all logical zero levels or all logical one levels.

DETAILED DESCRIPTION OF ILLUSTRATIVE EMBODIMENTS

Figure 1:
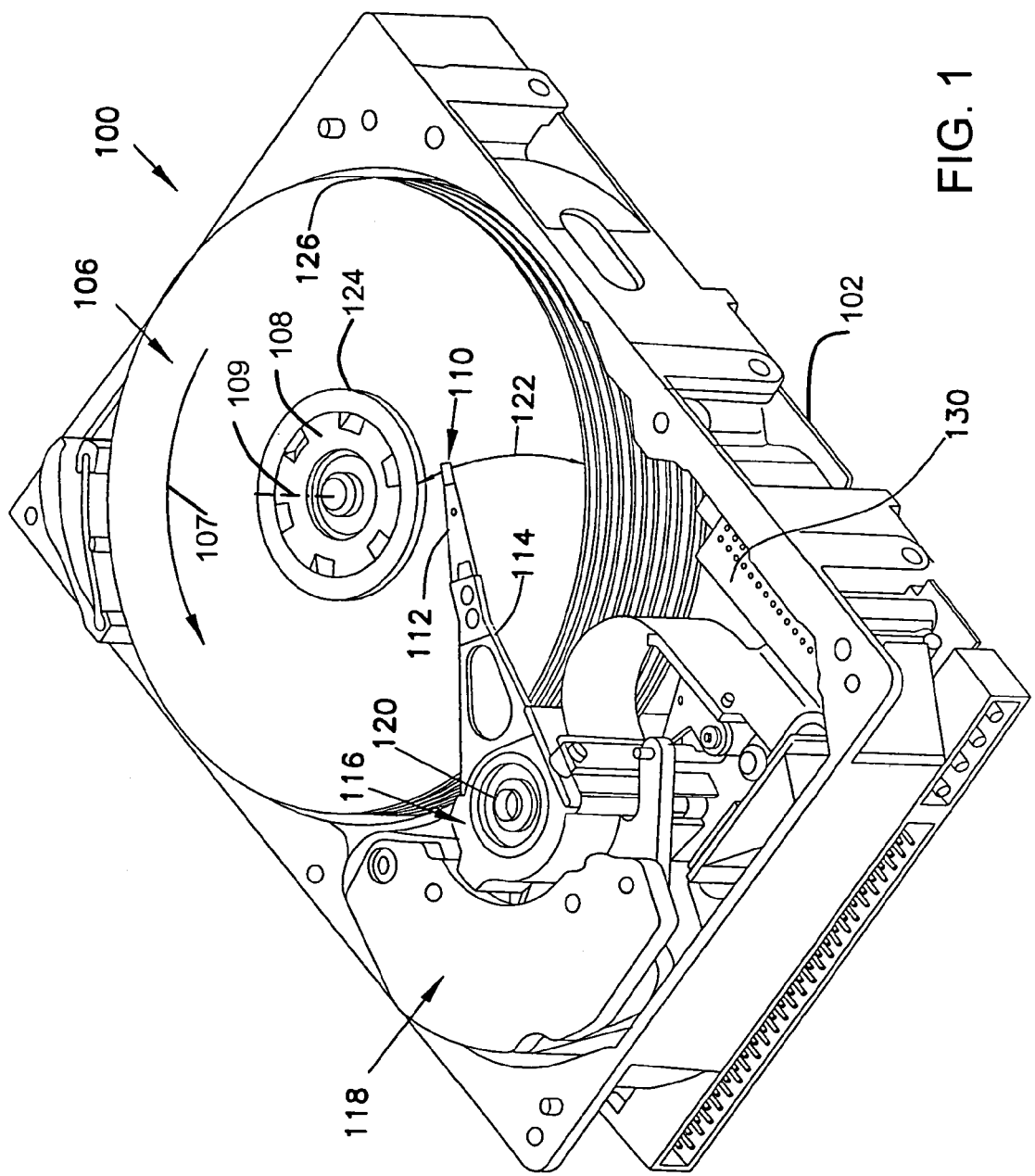
FIG. 1 is an isometric view of a disc drive.

In embodiments described below, a disc drive includes a data storage channel in which modulation coding is provided in the form of a modulation bit that is added to an error correction encoded word. Certain error correction encoded words that are either all zeros or all ones are considered "worst case" code words for synchronization because the error correction code word itself does not include any transitions. In one embodiment, the error correction encoded word is arranged to have an odd number of bits. When "worst case" error correction encoded words (i.e., words with all zero or all one logic levels) are encountered, the modulation bit that is calculated on an odd number of data bits is a parity bit that has a logic level that is opposite that of the data bits. The opposite logic levels of the data and the parity bit in the "worst case" words ensures that at least one logic level transition occurs in each modulation encoded word. During readback of data, the presence of the transition between data and modulation bit ensures that the worst case words have at least one transition for synchronizing a readback clock. Conventional DC-free modulation decoding is avoided, and high modulation coding rates are maintained.

In data storage apparatus, data is recorded on data storage media, and then read back from the data storage media at a later time. The data that is read back includes errors. The data is typically encoded with error correction coding, and the readback process include error correction decoding that corrects the errors.

The data is also typically encoded with so-called "modulation encoding" to adapt the data to known characteristics of the media channel such as bandpass characteristics. Well-known modulation encoding methods include RZ, NRZ, Biphase, Manchester and Miller types of codes. Modulation encoding typically includes "DC free" coding to improve the compatibility with bandpass characteristics of the channel.

When data is read back, the original synchronization of the recorded data with a data clock is lost, and a readback clock is synchronized with the read data in order to identify time of transitions between individual data bits. Modulation encoding has typically included run length limited (RLL) encoding that encodes data so that it includes added synchronization transitions for synchronizing the readback clock. The addition of run length limited (RLL) encoding adds encoding and decoding overhead and deteriorates modulation code rates.

With the advance from use of longitudinal to perpendicular recording media, the bandpass characteristics of the read/write channel have changed such that the need for DC free characteristics in modulation coding is considerably reduced or eliminated. The need for clock synchronization, however, remains with the use of perpendicular recording media. There is a need for a modulation coding scheme that ensures reliable synchronization of the readback clock without the added coding overhead of DC free coding.

FIG. 1 is an isometric view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation in a direction 107 about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft is 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

Figure 2:
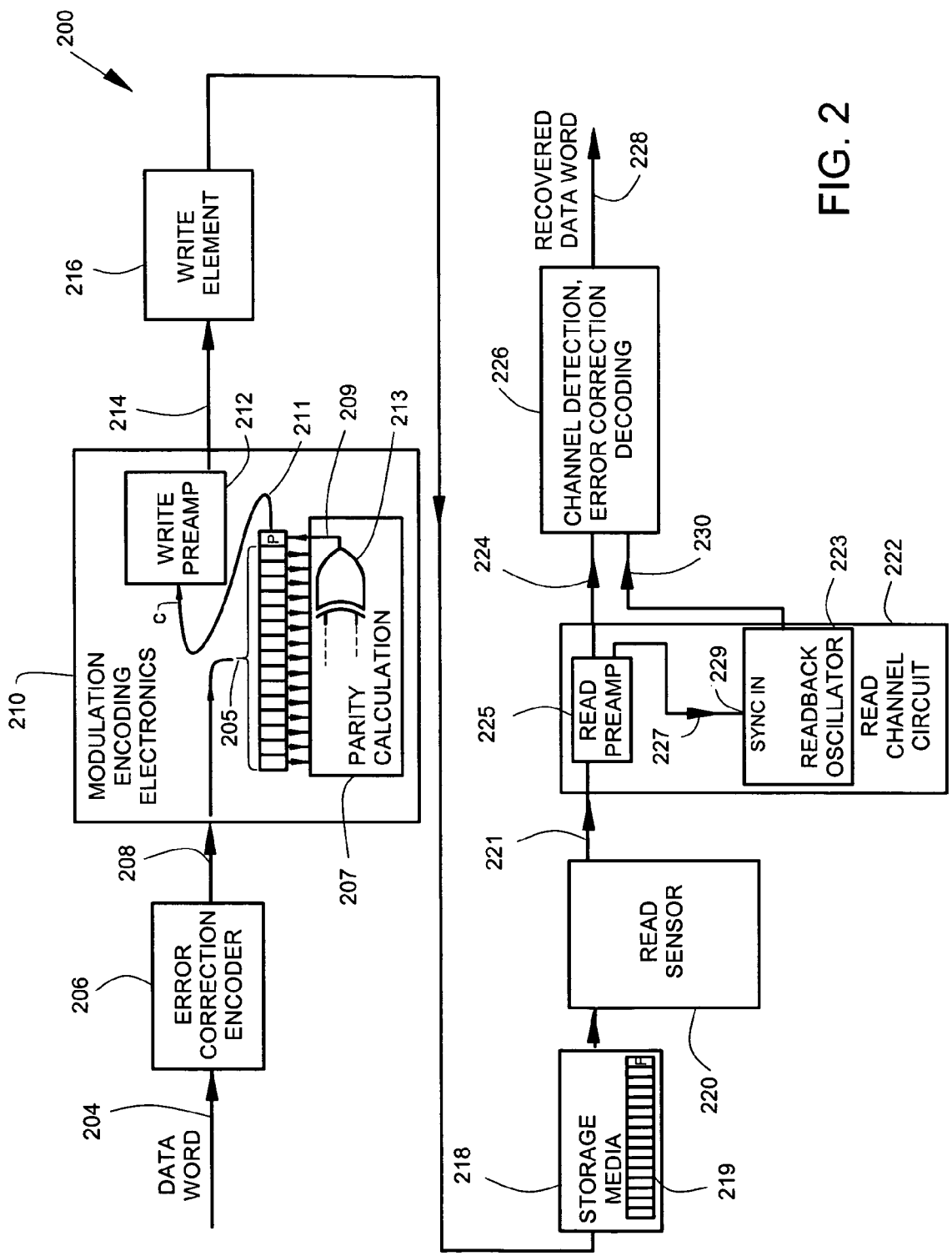
FIG. 2 illustrates a storage channel in a disc drive.

FIG. 2 illustrates an exemplary storage channel 200 that can be included in apparatus such as disc drive 100 in FIG. 1, for example. The storage channel 200 generally comprises an apparatus (or coding circuit), e.g., error correction encoding electronics, modulation encoding electronic circuitry, a read/write head, read channel circuitry, channel detection and error correction decoding electronics. As explained in more detail below, DC-free modulation decoding (demodulation) is not required in the storage channel 200. Modulation encoded words can, if desired, be passed on to the channel detector without demodulation.

The storage channel 200 comprises modulation encoding electronics 210 that receives an error correction encoded data word 208. In one embodiment, the error correction data word 208 includes an odd number of bits. The data word 208 can be a user word or another word generated by a host system. The error correction encoded data word 208 is generated by electronics (also called an error correction encoder) 206. The electronics 206 receives data word 204 and encodes the data word with one or more error correction codes. Error correction coding processes are selected than increase the number of output bits in the error correction encoded data word 208.

The modulation encoding electronics 210 includes modulation bit calculation electronics 207 that calculate modulation bit P for the bits 205. In one embodiment, a parity calculation is performed by a multiple input exclusive OR gate 213 that receives an uneven number of bits 205 as inputs. An output 209 of the exclusive OR gate 213 provides the calculated parity bit P. In one embodiment, the modulation encoding electronics 210 adds (concatenates) the odd number of bits 209 and a single parity check bit P 211 to form a modulation code 211 as illustrated. The parity bit P can alternatively be inserted between successive bits 205. The term "add" as used here refers to assembling bits with one another rather than an arithmetic addition of numbers. As explained in more detail below in connection with FIGS. 5A, 5B, the addition of an odd number of bits of an error correction encoded data word 208 with a parity bit (that is calculated based on the odd number of bits) results in an added word 211. The word 211 includes one or more bit transitions, for all possible values of the error correction encoded data word 208. With this arrangement, the possibility is eliminated of having an added word 211 that has no bit transitions. Each added word 211, therefore, can be relied on to include at least one bit transition for later use in synchronizing a readback oscillator 223 during a later readback process.

The modulation code word 211 couples via a write preamplifier 212 and a write element 216 to storage media 218 where the added code 211 is written as modulation code 219 in magnetic bits in the storage media 218. At a later time, the modulation code 219 is read back from the storage media 218 by a read sensor 220. The read sensor 220 provides a read sensor output 221 to a read preamplifier 225. In one embodiment, the read preamplifier 225 comprises a variable gain amplifier (VGA) and filtering circuits. The read preamplifier 225 amplifies the read sensor output 221 and provides an amplified read sensor output 227 to a synchronization input 229 of the readback oscillator 223. In a preferred embodiment, the readback oscillator 223 comprises a phase lock loop (PLL) type of oscillator. Transitions (changes from 1 to 0, or from 0 to 1 logic levels) in the read sensor output 227 synchronize the readback oscillator 223 with the stream of data that is being read. Because of the arrangement with an odd number of bits added to a parity bit, there is always at least one transition available for synchronization in each correctly read word.

In the read channel circuit 222, there is no need for any logic for modulation decoding (demodulation). The data that is read can be passed on directly, without demodulation decoding, to error correction decoding electronics 226. The parity bit, which was used for modulation encoding to ensure oscillator synchronization, can be used by the error correction decoding electronics 226 to detect parity errors, in addition to other error correction decoding that is the inverse of the error correction encoding performed in block 206. The process of DC free demodulation decoding (such as RLL decoding) is eliminated, and the single parity bit that was used for modulation encoding can be used for additional error correction without deterioration of error correction bit rate. The modulation encoding (i.e., addition of parity bit to a word with an odd number of bits) has a code rate of k/(k+1), which is higher than the codes designed using traditional methods. Further, the method has no error propagation during decoding process. Compared with other modulation encoding processes such as RLL encoding, the encoding process is simple and requires little power, and adds little delay.

The readback oscillator 223 provide a readback oscillator output 230 that is synchronized by readback of the modulation code from the storage media 218. The readback oscillator output 230 couples to error correction decoding electronics 226. The read preamplifier 225 provides an amplified modulation code output 224 to the error correction decoding electronics 226. The output 224 can be a soft or hard decision type of data output. The amplified modulation code output 224 is a readback signal and typically includes readback errors that are corrected by the error correction decoding electronics 226. The error correction decoding electronics 226 reproduces data word 204 as function of synchronization provided by the readback oscillator output 230 and data provided at the readback output 224. Details of the modulation encoding electronics 210 are described in more detail below by way of an example shown in FIG. 3. Details of the function of the read channel 222 and error correction decoding electronics 226 are described in more detail below by way of an example illustrated in FIG. 4.

Figure 3:
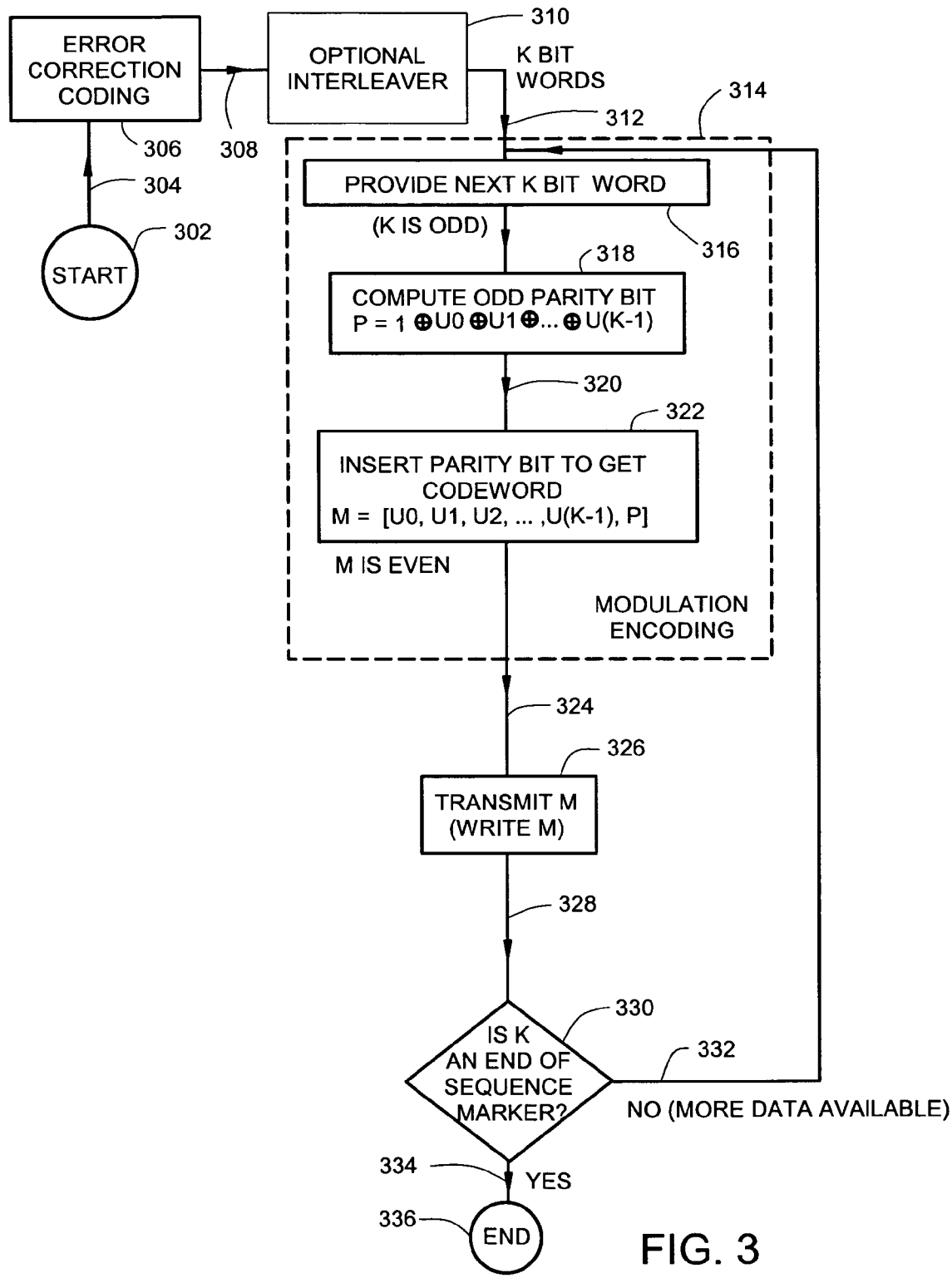
FIG. 3 illustrates a block diagram of writing data to storage media.

FIG. 3 illustrates an exemplary block diagram of processes performed when writing (transmitting) data to media. Processing starts at start 302 and continues along line 304 to error correction coding 306. Error correction coding 306 comprises known error correction coding processes and can include error correction encoding processes such as block, Hamming, Golay, Reed-Muller, BCH, Reed-Solomon, convolutional codes or other known error correction codes, provided that the error correcting code generate an odd number of bits in each word of error correction encoded data words. Error correction coding 306 is performed on data word and generates error correction encoded data words. The error correction encoded data word have an odd number of bits.

After completion of the error correction coding 306, processing continues along line 308 to an optional interleaving process 310. Processing then continues along line 312 where a K bit error correction encoded word, with an odd number of bits, is provided to a modulation encoding process 314 indicated by a dashed line box. As K bit words are received from line 312, the K bits words are provided one at a time by process 316 to parity computing process 318. The parity computing process 318 computes the parity bit P as shown in block 318.

After completion of the parity computation process 318, processing continues along line 320 to a bit addition process 322. The bit addition process 322 adds the K bit word and the parity bit together. The parity bit is typically inserted at the end of the K bit word as illustrated. The addition process 322 is typically a concatenation process as illustrated, and results in a modulation encoded word M (also referred to as word C in FIG. 2). The word M has an even number of bits.

After completion of the addition process 322, processing continues along line 324 to a write process 326. In the write process 326, also called transmission process 326, modulation encoded data word M is written to the media, or alternatively data word M is loaded in a buffer for transmission to the media along with subsequent modulation encoded data words.

After completion of process 326, processing continues along line 328 to decision block 330. At decision block 330, if the last word processed was not an end of sequence marker, then processes continues along line 332 which goes back to process 316 for providing the next word in a current sequence. If the last word processed is an end of sequence marker, then processing continues from decision block 330 along line 334 to end 336.

Figure 4:
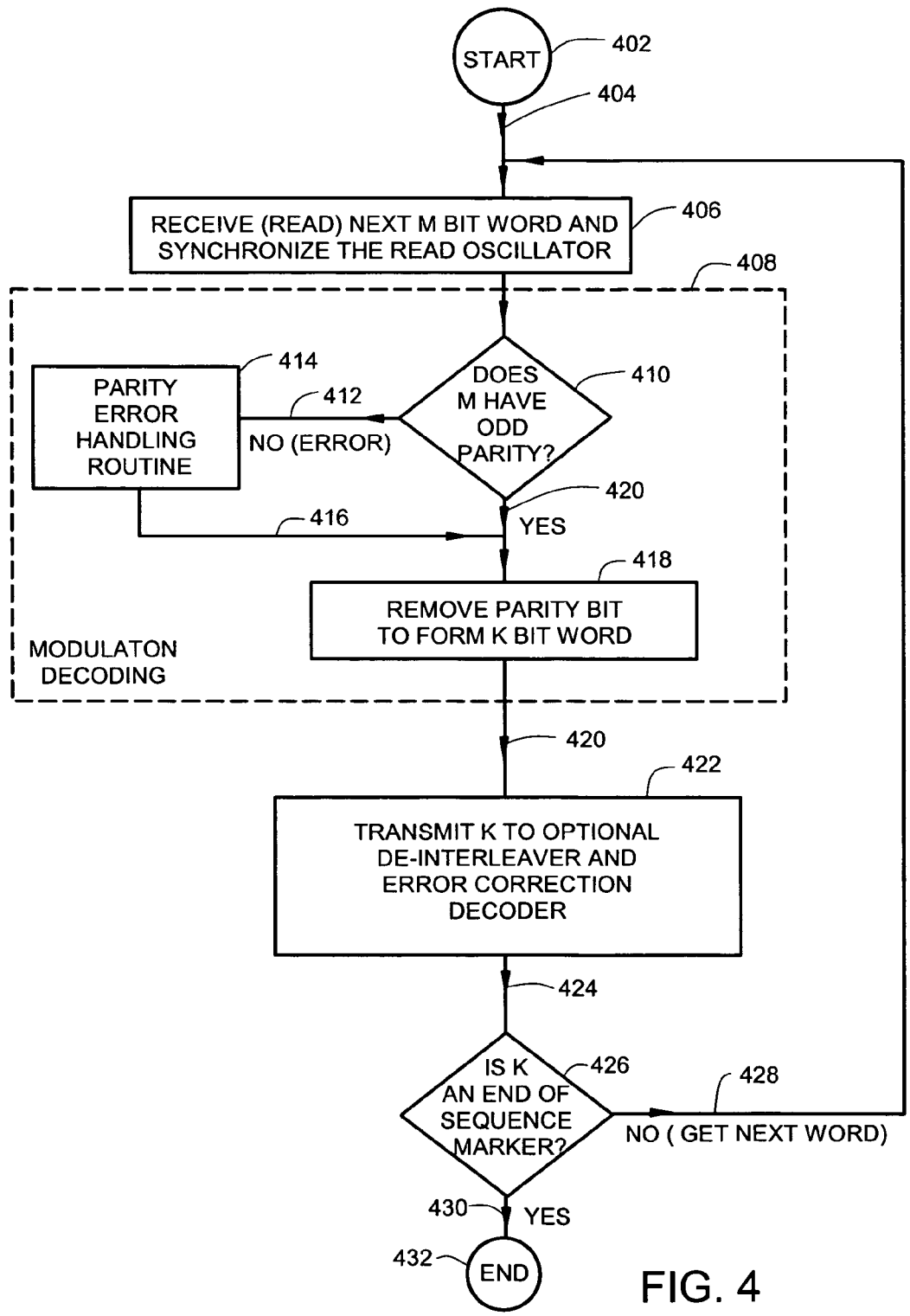
FIG. 4 illustrates a block diagram of reading data from storage media.

FIG. 4 illustrates an exemplary block diagram of processes performed when reading (receiving) data from the media. Processing begins at start 402 and continues along line 404 to receiver process 406.

At process 406 a word which has been read from the media is received, used to synchronize a read oscillator, and stored in a buffer. Since convention DC free demodulation (such as RLL demodulation) is not need, processing continues along line 408 to a parity error checking process indicated by a dashed line block 408. In parity checking process 408, a decision block 410 tests whether the received word has odd parity. If the received word has a parity error, then processing continues along line 412 to a parity handling routine 414. The parity handling routine makes a record of the error for use in later error correction decoding processes and then processing continues along line 416 to process 418. If the received word is not found to have a parity error at decision block 410, then processing continues from decision block 410 along line 420 to process 418.

At optional process 418, the parity bit is removed, and the original K bit word remains. Processing continues along line 420 to process block 422.

At process block 422, the K bit word is transmitted to a de-interleaver (if an interleaver was used in write processes) and to error correction decoding processes. The error correction decoding process comprises an inverse of the error correction encoding processes that were used in writing the data.

After completion of process block 422, processing continues along line 424 to decision block 426.

At decision block 426, if K is not an end of sequence marker, then processing continues along line 428 to go back to process 406 for receiving the next word in the sequence. At decision block 426, if K is an end of sequence marker, then all words in the sequence have been received, recovered data word is generated, and processing continues along line 430 to end 432.

It is to be understood that the processes illustrated in FIGS. 3-4 are exemplary processes. Processes performed in different order and with different steps can be used by those skilled in the art to achieve the same results.

FIG. 5A illustrates a modulation code word in which all of the data bits 1-19 are logical zero levels. There are an odd number of data bits 1-19. The parity bit for an odd number of logical zero level bits is a logical 1 level parity bit at bit 20. There is a logic level transition (edge for synchronization) between bits 19 and 20.

FIG. 5B illustrates a modulation code word in which all of the data bits 1-19 are logical one levels. There are an odd number of data bits 1-19. The parity bit for an odd number of logical one level bits is a logical 0 level parity bit at bit 20. There is a logic level transition (edge for synchronization) between bits 19 and 20. FIGS. 5A and 5B illustrate worst case synchronization code words in which the synchronization relies on the transition between data and parity bit for synchronization. With all other possible code words, transitions occur in the data itself and provide synchronization for the code word.

Using modulation coding with a parity check bit, parity checking can detect the most dominant error events present at a Viterbi detector output, and errors can be further corrected by an error correction decoding post processor. In order to achieve the best system performance, it is always desirable to have the overall code rate (including both error correction and modulation coding) as high as possible.

The error correction encoded data sequence is $u=[u_0, u_1, u_2, \ldots u_{k-1}]$, where k is odd. The odd parity bit is computed as $$p = 1 \oplus u_0 \oplus u_1 \oplus \ldots \oplus u_{k-1}$$

where $\oplus$ stands for exclusive OR operation. The resulting code word is $$c = [u_0, u_1, u_2, \ldots u_{k-1}, p]$$

The modulation encoding using a parity bit ensures a maximum run length of either logical 1 or logical 0 is (k−1), since there are no more than k bits of consecutive 0's or 1's in the coded data sequence. If there are k bits of 0's in the error correction encoded bits, the odd parity bit p=1 is inserted at the end of the codeword. This will guarantee the maximum length of 0's is k. If there are k bits of 1's in the error correction encoded bits, the odd parity bit p=0 (since k is odd) is inserted at the end of the codeword. This will guarantee the maximum length of 1's is k. These two cases are the worst cases. All other bit combinations include transitions in the error corrected data word itself. By using this method, one can design a rate k/(k+1) modulation code. At the same time, one can get the equivalent synchronization performance of a rate 1 RLL(0,k−1) codes at free cost. The overall code rate of this modulation code with single parity check bit code is k/(k+1).

The decoding process is straightforward. Note that the modulation code is systematic code, one can get back the error correction encoded bits by simply removing the parity bit p inserted at the end (or elsewhere) in the codeword.

On one hand, the run length constraint k for both 0 and 1 bits is small enough to provide timing information (synchronization) for the timing recovery loop in the read channel circuit. On the other hand, k should also be large enough so that the overall code rate is as high as possible.

Figure 6:
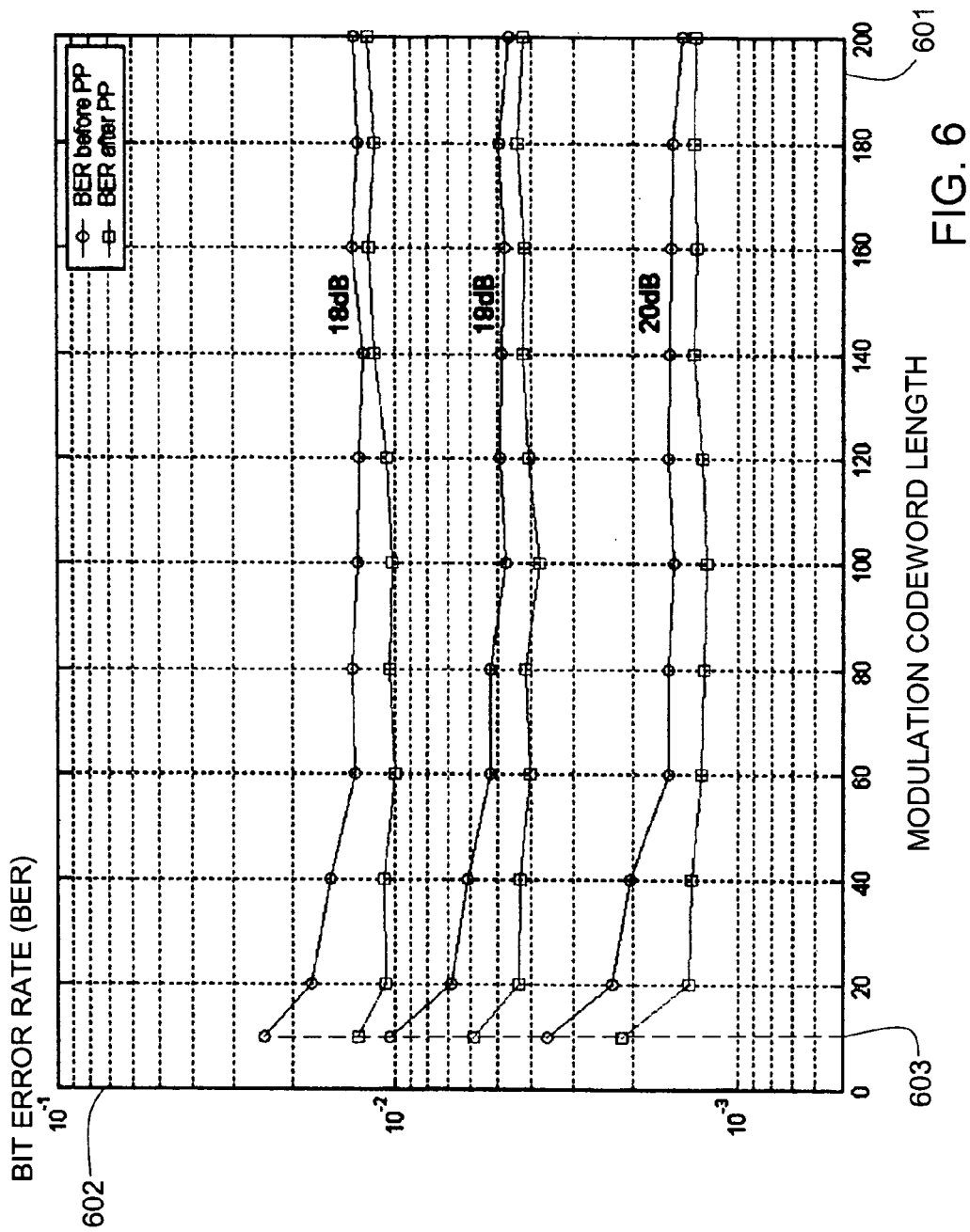
FIG. 6 illustrates simulated performance of the use of an added parity bit as a modulation code.

FIG. 6 illustrates performance results of a Monte Carlo simulation of the use of an added parity bit as a modulation code on a error correction encoded data word with an odd number of bits. A horizontal axis 601 indicates modulation code word length. A vertical axis 602 indicated bit error rate (BER). Data points indicated by circles represent BER values before post processing (PP). The post processing comprises error correction decoding. Data points shown as circles represent BER before post processing. Data points shown as squares represent BER after post processing. Data is presented for three different levels of noise, 18 dB, 19 dB and 20 dB noise levels.

In the simulation, a perpendicular recording channel model is used and the PR target is chosen as [1 10 11]. The injected noise is a mixture of 20% additive white Gaussian noise (AWGN) and 80% of jitter. At the output of Viterbi detector, a parity processor is designed to detect and correct odd error events within the parity check codeword. To study the system performance due to the parity check codeword length, we measure the bit error rate (BER) at the Viterbi detector output and the parity processor output for different parity check codeword length. From the results, it is observed that the BER before parity post processor (PPP) is the worst when the parity codeword length k is 10 bits (at 603) for all signal to noise ratios (SNRs). With the increase of the k, bit error rates (BERs) before PPP are improved gradually and saturated when k is large enough (>100 bits) for all SNRs environments. This is due to the code rate loss becomes smaller with the increase of parity check codeword length k. For each SNR, we also measured BER after PPP. It is expected the BER gain with the help of parity check information is bigger when the parity check code word is small. This can be verified from FIG. 6 that BER gaps between the circle data point and square data points is bigger when k is relatively small. However, one needs also consider the performance loss when the system suffers from code rate loss. From FIG. 6, it is noted that the BER curves after PP shows a bathtub shape. That is, when k is in the range of 20~120, BER after PPP is minimum. When k>120, BER after PP becomes higher. This can be explained that the error correction capability becomes smaller when there is less parity check information available when the codeword length becomes bigger. This suggests that the optimum parity check codeword length is in the range of 20~120 bits. Consider the timing recovery requirement, it is preferred to have as many transitions as possible in the coded sequence. Thus, we can choose the smallest codeword length k without significant BER loss after PP. Further, a scrambler (interleaver) included in the electronics (error correction encoder) before the modulation encoder will help to randomize the input data and provide timing recovery information. The error correction decoder can include a corresponding de-interleaver.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the apparatus with a recording channel while maintaining substantially the same functionality without departing from the scope and spirit of the present invention. In addition, although the preferred embodiment described herein is directed to a magnetic system for data storage, it will be appreciated by those skilled in the art that the teachings of the present invention can be applied to optical and ferroelectric data storage systems, without departing from the scope and spirit of the present invention.

What is claimed is:

1. An apparatus, comprising:
    electronics that provides worst case codewords without bit transitions between worst case codeword bits;
    electronic circuitry calculating modulation bits as a function of the worst case codeword bits and adding a modulation bit to the worst case codeword bits to form a modulated code word, the modulation bit having a bit polarity opposite a bit polarity of the worst case codeword bits to provide a bit transition; and
    decoder electronics that decode the modulated code word.

2. The apparatus of claim 1 wherein the bit transition synchronizes a readback oscillator.

3. The apparatus of claim 1 wherein the worst case codeword has an odd number of bits and the modulation bit comprises a parity bit.

4. The apparatus of claim 1 wherein the modulated code word does not include DC free coding, and the storage media comprises perpendicular recording media.

5. The apparatus of claim 1 wherein the modulation bit provides an effective run length limit for at least two worst case words.

6. The apparatus of claim 1 wherein the electronics provides codewords that include the worst case code word, and each modulated codeword includes at least one transition.

7. The apparatus of claim 1, wherein the modulated code words comprises a systematic code words.

8. The apparatus of claim 1 wherein the error coffection encoding electronics comprises an interleaver.

9. The apparatus of claim 1 wherein the worst case codeword bits comprise bits all having the same logic value.

10. A modulation process, comprising:
    providing a data word to provide a worst case codeword without bit transitions between worst case codeword bits;
    calculating a modulation bit as a function of the worst case codeword the modulation bit having a bit polarity opposite a bit polarity of the worst case codeword bits; and
    adding the worst case codeword bits with the modulation bit to form a modulated code word.

11. The modulation process of claim 10 and further comprising:
    providing a readback oscillator; and
    synchronizing the readback oscillator by coupling the modulation code word to the readback oscillator.

12. The modulation process of claim 11 and further comprising:
    forming the worst case codeword with an odd number of bits; and
    forming the modulation bit as a parity bit of the worst case codeword.

13. The modulation process of claim 10 wherein the worst case codeword bits comprise bits all having the same logic value.

14. A demodulation process, comprising:
    receiving a modulation code word that comprises a worst case codeword and a modulation bit;

testing the received modulation code word for polarity and storing a testing result; and removing the modulation bit from the modulation code word to generate a reproduced worst case codeword, wherein the modulation bit has a bit polarity which is opposite a bit polarity of the worst case codeword and which provides a bit transition to the worst case codeword.

15. The demodulation process of claim 14 wherein the modulation code word includes a transition between the worst case code word and the modulation code that synchronizes a readback oscillator.

16. The demodulation process of claim 14 wherein the worst case codeword comprises an odd number of bits and the modulation bit comprises a parity bit.

17. The demodulation process of claim 14 and further comprising de-interleaving of the modulation code word.

18. The demodulation process of claim 14 and further comprising channel detection of the modulation code word.

19. The demodulation process of claim 14 and further comprising error correction decoding of the modulation code word.

20. The demodulation process of claim 14 wherein the decoding process is free of DC-free decoding processes.

21. The demodulation process of claim 14 wherein the modulation bit is calculated using a multiple input exclusive OR gate.

22. The demodulation process of claim 14 wherein the parity bit is concatenated with the error correction encoded data word.

23. The demodulation of claim 14 wherein the worst case codeword comprises bits all having the same logic values.

24. The demodulation of claim 14 wherein the modulation bit has a bit polarity which is opposite a bit polarity of the worst case codeword and which provides a bit transmission to the worst case codeword.

* * * * *

UNITED STATES PATENT AND TRADEMARK OFFICE
CERTIFICATE OF CORRECTION

PATENT NO. : 7,397,398 B2  
APPLICATION NO. : 11/431122  
DATED : July 8, 2008  
INVENTOR(S) : Jin et al.

Page 1 of 1

It is certified that error appears in the above-identified patent and that said Letters Patent is hereby corrected as shown below:

Column 8
Line 38, delete "coffection" and insert --correction--

Signed and Sealed this

Twenty-fourth Day of November, 2009

David J. Kappos
*Director of the United States Patent and Trademark Office*